United States Patent [19]

Schinabeck et al.

[11] Patent Number: 4,635,259

[45] Date of Patent: Jan. 6, 1987

[54] METHOD AND APPARATUS FOR MONITORING RESPONSE SIGNALS DURING AUTOMATED TESTING OF ELECTRONIC CIRCUITS

[75] Inventors: John Schinabeck, Pleasanton; James R. Murdock, San Jose, both of Calif.

[73] Assignee: Fairchild Semiconductor Corporation, Cupertino, Calif.

[21] Appl. No.: 611,448

[22] Filed: May 17, 1984

Related U.S. Application Data

[63] Continuation-in-part of Ser. No. 518,499, Aug. 1, 1983, abandoned.

[51] Int. Cl.[4] .............................................. G01R 31/28
[52] U.S. Cl. .................................. 371/20; 324/73 R; 364/579; 371/25
[58] Field of Search ............................. 371/20, 25, 27; 324/73 R, 73 AT, 73 PC; 364/579, 580

[56] References Cited

U.S. PATENT DOCUMENTS

| | | | |
|---|---|---|---|
| 3,657,527 | 4/1972 | Kassabgi et al. | 371/25 |
| 4,044,244 | 8/1977 | Foreman et al. | 371/20 |
| 4,055,801 | 10/1977 | Pike et al. | 324/73 R |
| 4,070,565 | 1/1978 | Borrelli | 371/20 |
| 4,168,527 | 9/1979 | Winkler | 364/580 |
| 4,271,515 | 6/1981 | Axtell, III et al. | 371/25 |
| 4,439,858 | 3/1984 | Peterson | 371/20 |
| 4,517,512 | 5/1985 | Petrich et al. | 324/73 R |
| 4,523,312 | 6/1985 | Takeuchi | 371/25 X |

Primary Examiner—Charles E. Atkinson
Attorney, Agent, or Firm—Theodore S. Park; Bruce D. Riter; Robert C. Colwell

[57] ABSTRACT

A plurality of test signal applying and response signal monitoring circuits is coupled to pins of an electronic device being tested to force test stimuli signals onto input pins of the device under test. The response signals are monitored while the device is being tested. Each test signal applying and response signal monitoring circuit includes a node to be coupled to a pin of the device under test, a digitally programmed source for supplying a test signal connectable to the node by a first switch, and a comparison circuit connected to the node by a second switch for indicating the relative magnitude of the response signal with respect to a programmed reference level on a repetitive basis during testing to increase test rate. Other features are also disclosed.

11 Claims, 3 Drawing Figures

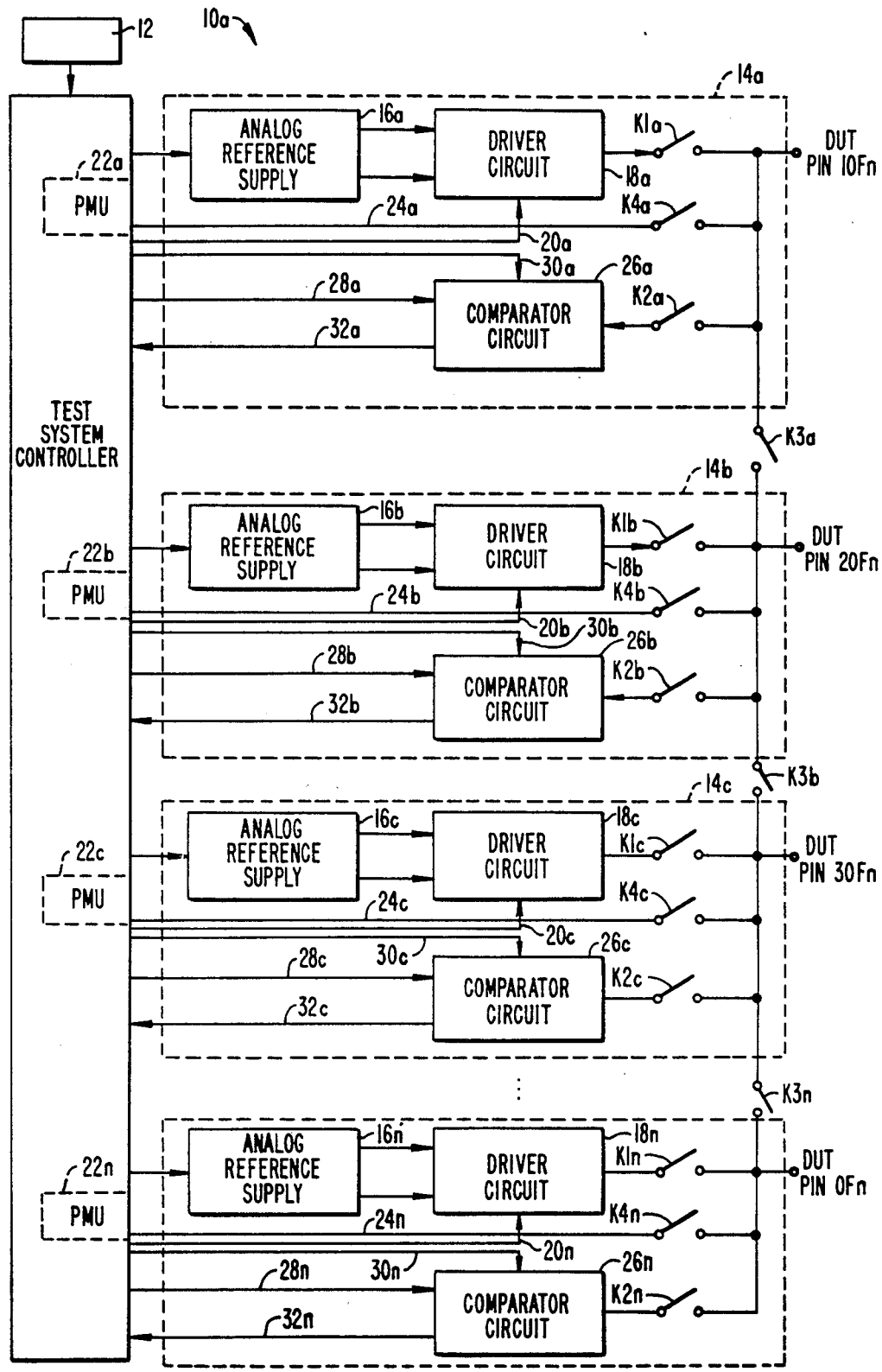
FIG._1.

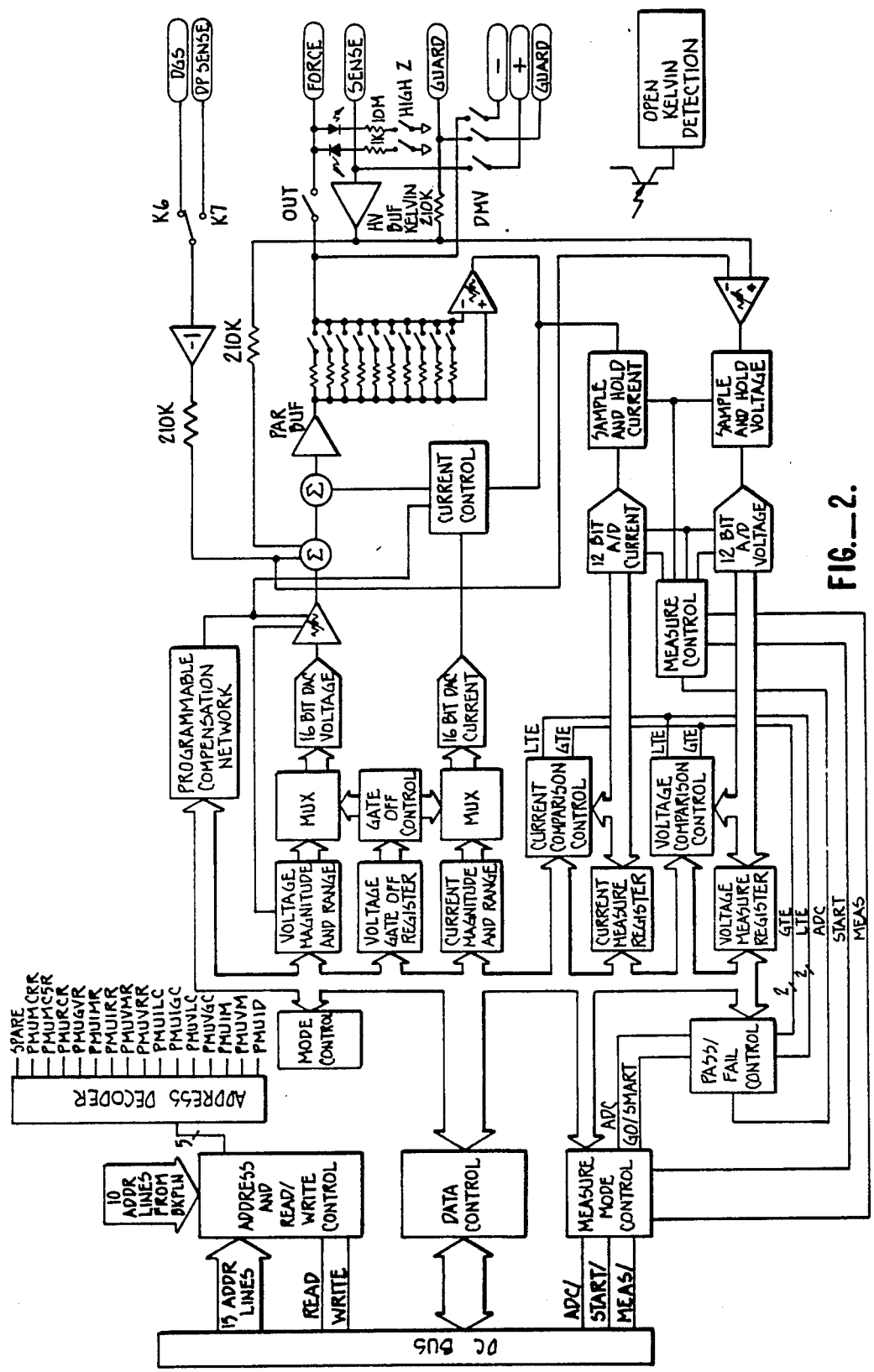
FIG._2.

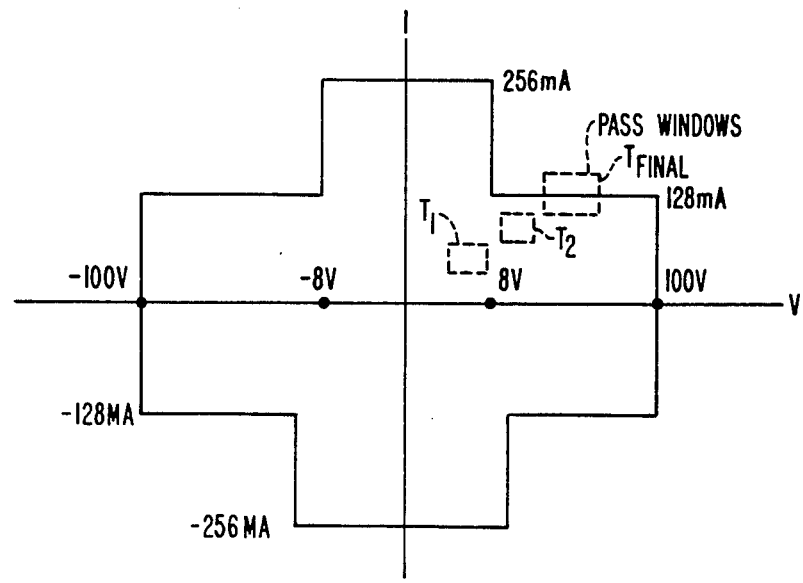
FIG._3.

METHOD AND APPARATUS FOR MONITORING RESPONSE SIGNALS DURING AUTOMATED TESTING OF ELECTRONIC CIRCUITS

CROSS-REFERENCE TO RELATED APPLICATIONS

This relates to the automated electronic test equipment disclosed in, and is a continuation-in-part of, the copending patent application of Richard F. Herlein, Rodolfo F. Garcia, Robert L. Hickling, Burnell G. West, Jamal Alrawi, Jeffrey A. Davis, John G. Campbell, Ronald L. Cline, E. J. Cotriss, John R. Schinabeck, and James R. Murdock, entitled HIGH SPEED TEST SYSTEM, U.S. Ser. No. 518,499, filed on Aug. 1, 1983, and assigned to the same assignee as this application, now abandoned. This also relates to the test signal applying and monitoring circuit described in the copending patent application of John Schinabuk and James R. Murdock, entitled METHOD AND APPARATUS FOR APPLYING AND MONITORING PROGRAMMED TEST SIGNALS DURING AUTOMATED TESTING OF ELECTRONIC CIRCUITS, U.S. Ser. No. 611,445, and a copending patent application of John Schinabeck, entitled METHOD AND APPARATUS FOR MONITORING AUTOMATED TESTING OF ELECTRONIC CIRCUITS, U.S. Ser. No. 611,449, as well as copending patent applications U.S. Ser. No. 611,266, entitled TEMPERATURE STABILIZED GATE; U.S. Ser. No. 611,267, entitled TEST PERIOD GENERATOR FOR AUOTMATIC TEST EQUIPMENT; U.S. Ser. No. 611,446, entitled FORMATTER FOR HIGH SPEED TEST SYSTEM; U.S. Ser. No. 611,451, entitled METHOD AND APPARATUS FOR DYNAMICALLY CONTROLLING THE TIMING OF SIGNALS IN AUTOMATIC TEST SYSTEMS; U.S. Ser. No. 611,452, entitled GATE HAVING BALANCED NODE; U.S. Ser. No. 611,453, entitled CONTROL OF SIGNAL TIMING APPARATUS IN AUTOMATIC TEST SYSTEMS USING MINIMAL MEMORY; U.S. Ser. No. 611,454, entitled MULTIPLE STAGE GATE NETWORK, and assigned to the same assignee.

BACKGROUND OF THE INVENTION

This invention relates to electronic circuits and, more particularly, to general purpose test systems capable of testing very large scale integrated (VLSI) circuits, including microprocessors, logic arrays, and multi-chip assemblies, at high speeds. Specifically, the invention is directed to a method and apparatus for automatically testing one or more electrical properties of a series of electronic circuits by monitoring response signals during testing of the electronic circuits in an automated electronic test system.

In automated electronic test equipment, one or more electrical signal sources is coupled to the pins or other nodes at the inputs of an electronic device being tested to force stimuli signals controlled by a test system computer onto the device under test, and the resultant conditions at the outputs of the device being tested are monitored. Typically, the stimuli signals represent logic states or analog voltages or currents which are applied in a parallel pattern to the input pins of the device under test, and the resulting output pattern is checked in parallel.

The signal sources apply stimuli signals to the device under test through pin electronics interface circuits which function as computer controlled interface circuits between the computer of the test system and the individual pins of the device being tested. The pin electronics interface circuits receive these stimuli signals and then through input drivers included in the pin electronics interface circuits switch these stimuli signals onto the desired input pins of the device under test in accordance with a stored program in the test system. The pin electronics interface circuits also receive reference voltages or currents which comparator circuits included in the pin electronics interface circuits compare to the voltages or currents received from the output pins of the device being tested. The output signals from the comparator circuits are returned to the test system computer where they are checked in accordance with a stored program for the proper responses. In this manner, electronic components, for example, semiconductor memories or other integrated circuits, can be individually tested to assure that they meet whatever standard or specifications the ultimate user of the integrated circuit desires.

One disadvantage in the operation of such automated electronic test equipment is the analog settling time. The length of the analog settling time can significantly slow parametric tests when a low current is forced. To set a specified current force condition of test, the programmable load (source or sink current) is applied while voltage comparators sense the limit of test. This current force/voltage measure type of test simulates typical high speed pin electronics interface circuit function at static rather than higher functional test rates allowing accuracy to the minimum resolution step of the voltage and current levels used. When the measurement parameter is a current with a voltage condition of test to be forced, the programmable load current is again used as the test forcing function. In this case, the forced current develops a load dependent voltage at the device under test, and voltage comparators are used to sense if this voltage is above or below the intended condition of test for a pass/fail decision. This procedure assures measurement accuracies to the minimum resolution step, where similar application of the same circuitry at high speed functional rates results in waveform aberrations that reduce the measurement resolution possible.

Mode reconfiguration switching and low current ranges typically limit analog speed to that required to maintain stable operation with a maximum specified capacitive load. This compensates for a worst case slow dynamic response.

Precision measurement unit per pin tests are restricted to the range extremes and minimum resolution of the pin electronics interface circuits which have been optimized for high speed functional testing. With pulse aberrations common on high speed waveforms, the minimum resolution step is likely to be greater than desired for some static measurements. Further restrictions occur when pin electronics interface circuit levels are generated in the test system computer and multiplex switched to groups of pin electronics interface circuit channels. This type of architecture is slower in analog settling due to the long cable from the computer of the test system to the test head and also presents a time consuming software burden to arrive at a measured value per device under test pin. Distributing pin electronics interface circuit levels via a multiplex switch from test system computer modules requires long analog settling times and limits practical precision measurement unit per pin function to go/no-go limit tests.

It is desirable that analog slew rate not be limited to the worst case programmed range and reactive load combination. This can be referred to as an unconditionally stable source but typically results in an unconditionally slow one. Since stable operation with various capacitive loads is required, the technique commonly employed for optimum test speed is to allow programmable loop rolloff, thereby matching the digitally programmed source dynamic characteristic to the test range and load conditions.

Limited current overshoot during slew is desirable to enhance test speed, but voltage overshoot can damage the device being tested. While known digitally programmed sources have some capability to respond to sudden current demand changes, their worst case compensated slow dynamic response can allow damaging transients to occur.

SUMMARY OF THE INVENTION

The present invention provides a method and apparatus for applying analog voltages or currents to nodes of a device under test and monitoring resulting currents or voltages so as to evaluate electrical characteristics of the device being tested so that test rates are increased. The method and apparatus in accordance with the invention substantially reduce the impact of analog settling time, thereby increasing test rate.

According to this invention, a method and apparatus are provided for automatically applying a test signal to and monitoring a response signal at a node of a device under test. The invention provides a method for repeatedly monitoring the response signal at a node of a device under test caused by a test signal applied to the node by digitally programmed source means switchably connected by a first switch means to the node and comparison means switchably connected by a second switch means to the node. The method comprises the steps of: connecting the test signal to the node; repetitively comparing the response signal with a programmed reference level; and repetitively providing an indication of the relative magnitude of the response signal with respect to the programmed reference level. Preferably, the method further comprises the steps of continuing to apply the test signal to and to monitor the response signal at the node in the event that the response signal has a first predetermined relationship with respect to the programmed reference level and providing a fail signal in the event that the response signal has a second predetermined relationship with respect to the programmed reference level.

In accordance with another aspect of the invention, an embodiment of apparatus for applying a test signal to and monitoring a response signal at a node of a device under test is provided. The apparatus comprises: digitally programmed source means switchably connected by a first switch means to the node for supplying test signals to the node; and comparison means switchably connected by a second switch means to the node for indicating the relative magnitude of the response signal with respect to a programmed reference level on a repetitive basis. Preferably, the apparatus further comprises control means for continuing to apply the test signal to and to monitor the response signal at the node in the event that the response signal has a first predetermined relationship with respect to the programmed reference level and means for providing a fail signal in the event that the response signal has a second predetermined relationship with respect to the programmed reference level.

Additionally, the invention provides a method for repeatedly monitoring the response signal at a node of a device under test caused by a test signal applied to the node by digitally programmed source means having a preselected programmed voltage-current characteristic defined by not-to-exceed voltage rail and current rail levels switchably connected by a first switch means to the node and comparison means switchably connected by a second switch means to the node. The method comprises the steps of: connecting the test signal to the node; repetitively comparing the response signal voltage at the node with a first programmed voltage level; repetitively comparing the response signal voltage at the node with a second programmed voltage level; repetitively comparing the response signal current at the node with a first programmed current level; repetitively comparing the response signal current at the node with a second programmed current level; repetitively providing an indication of the relative amplitude of the response signal voltage and current with respect to the first and second programmed voltage levels and first and second programmed current levels, respectively; continuing to apply the test signal to and to monitor the response signal at the node in the event that the response signal voltage and current have a first predetermined relationship with respect to the first and second programmed voltage levels and first and second programmed current levels, respectively; and providing a fail signal in the event that the response signal voltage and current have a second predetermined relationship with respect to the first and second programmed voltage levels and first and second programmed current levels, respectively. Preferably, the test signal is a forcing function which starts at zero volts and one percent of the maximum current of a preselected voltage-current range.

Furthermore, the invention provides apparatus for repeatedly monitoring the response signal at a node of a device under test caused by a test signal applied to the node. The apparatus comprises: digitally programmed source means switchably connected by a first switch means to the node, the digitally programmed source means having a preselected programmed voltage-current characteristic defined by not-to-exceed voltage rail and current rail levels for supplying test signals to the node; first comparison means switchably connected by a second switch means to the node for repetitively indicating the relative amplitude of the response signal voltage at the node with respect to a first programmed voltage level; second comparison means switchably connected by the second switch means to the node for repetitively indicating the relative amplitude of the response signal voltage at the node with respect to a second programmed voltage level; third comparison means switchably connected by the second switch means to the node for repetitively indicating the relative amplitude of the response signal current at the node with respect to a first programmed current level; fourth comparison means switchably connected by the second switch means to the node for repetitively indicating the relative amplitude of the response signal current at the node with respect to a second programmed current level; control means for continuing to apply the test signal to and to monitor the response signal at the node in the event that the response signal voltage and current have a first predetermined relationship with respect to the first and second programmed voltage levels and first and second programmed current levels, respectively; and means for providing a fail signal in the event that the response signal voltage and current have a second predetermined relationship with respect to the first and second programmed voltage levels and first and second programmed current levels, respectively. Preferably, the digitally programmed source means is a crossover source which supplies a test signal in the form of a forcing function that starts at zero volts and one percent of the maximum current of a preselected voltage-current range.

Analog settling analysis in accordance with the invention is used to optimize test rate when required low current ranges force long analog settling times. Test plan specification for analog settling analysis includes definition of the maximum elapsed time to settle and loading four voltage and current limit registers to define a pass window. A continuous conversion process is initiated shortly after the digitally programmed source is connected and gated on. The digital conversion result is compared to limits, and if an early limit boundary crossing occurs, the test plan is allowed to continue. If no limit boundary crossing occurs before expiration of the maximum time duration, the test plan executes a fail branch.

Hundreds of milliseconds can be saved each time a test plan is executed. The same minimum and maximum limit registers are used for fast, dual limit go/no-go testing with the analog-to-digital conversion result stored for data log of measured values.

The digitally programmed sources are preferably four-quadrant, automatic crossover digitally programmed sources. On-board analog-to-digital converters are preferably provided for measured value results of the voltage and current operating point of the device being tested. Program selected rolloff allows the test plan to control optimum speed for each test condition.

Analog settling analysis in accordance with the invention reduces test time when inherently slow conditions of test are required. Program control of analog speed allows optimum match of the testing circuit to varying test requirements. The method and apparatus in accordance with the invention can be used for engineering characterization, production testing, incoming inspection, and quality assurance of complex integrated circuits, such as VLSI circuits.

The invention provides program controlled dynamic response and transient recovery times which are improved dramatically compared to known techniques. This does not delete the requirement for high frequency bypass near the device under test pins, but gives the test plan control of expected transient conditions. The faster response contributes to test throughput and provides a more sensitive indication when abnormal current demand change occurs during functional testing.

BRIEF DESCRIPTION OF THE DRAWINGS

The above and other features of the invention and the concomitant advantages will be better understood and appreciated by those skilled in the art in view of the description of the preferred embodiments given below in conjunction with the accompanying drawings. In the drawings:

FIG. 1 is a block diagram of a testing circuit fabricated according to the invention;

FIG. 2 is a schematic circuit diagram of the precision measurement units included in the testing circuit shown in FIG. 1; and FIG. 3 illustrates the voltage-current characteristics of the digitally programmed sources of the precision measurement units included in the testing circuit shown in FIG. 1.

DESCRIPTION OF THE PREFERRED EMBODIMENTS

The method and apparatus in accordance with the invention relate to general purpose test systems capable of testing electronic circuits. Such a test system is disclosed in the copending patent applications of Herlein et al. entitled HIGH SPEED TEST SYSTEM (U.S. Ser. No. 518,499 filed on Aug. 1, 1983, now abandoned) and of John Schinabeck and James R. Murdock, entitled METHOD AND APPARATUS FOR APPLYING AND MONITORING PROGRAMMED TEST SIGNALS DURING AUTOMATED TESTING OF ELECTRONIC CIRCUITS (U.S. Ser. No. 06/611,445 filed on the same date as this application) and assigned to the same assignee as this application, the disclosures of which are hereby incorporated by reference.

FIG. 1 is a block diagram of a testing circuit fabricated according to this invention. As shown in FIG. 1, a test signal applying and response signal monitoring circuit 10a communicates with a test head controller 12. The test head controller 12 is preferably implemented with a dedicated 68000 microprocessor manufactured by Motorola Inc. of Phoenix, Ariz. coupled with program and data random access memory (RAM) and 16 Kilobytes of bootstrap programmable read only memory (PROM). The test head controller 12 transmits control data and receives subsystem status reports, interrupt requests, and test data. The test head controller 12 is responsible for all communications between the test program and the testing circuit, with the exception of the down loading of test vectors which are handled by a test vector store (not shown). The test head controller 12 controls the pattern of test signals applied to the device under test (DUT) by the test signal applying and response signal monitoring circuit 10a. Several registers within the test head controller 12 allow control of each DUT pin while testing at the programmed rate.

The test signal applying and response signal monitoring circuit 10a includes a plurality of pin electronics interface circuits 14a, 14b, 14c, . . . 14n connected to n pins of the DUT. Preferably, one pin electronics interface circuit 14 is connected to each terminal of the multi-terminal DUT. Each pin electronics interface circuit 14 is capable of being operated by the test head controller 12 in one of several modes depending upon whether the pin electronics interface circuit is coupled to a DUT input signal terminal, DUT output signal terminal, or other various function or supply terminals. Thus, a DUT having sixteen terminals or pins is tested in a fixture containing sixteen identical pin electronics interface circuits 14 controlled by a single test head controller 12 containing a stored program specifically written to test the particular DUT.

For example, to functionally test a signal input terminal of the DUT, the test head controller 12 closes a relay contact K1a, for example, a reed relay contact, included in the pin electronics interface circuit 14a to connect the test stimuli section of the test signal applying and response signal monitoring circuit 10a to pin 1 of the DUT. This section of the test signal applying and response signal monitoring circuit 10a includes an analog reference supply 16a which in response to signals from the test head controller 12 generated according to a program stored in the test system computer produces two levels of direct current reference signals. These two reference signals are applied to a driver circuit 18a which biases the DUT between the two reference signals to produce a pattern of pulses for functional testing in accordance with data supplied to the driver circuit on a line 20a.

The test signal applying and response signal monitoring circuit 10a is also capable of performing parametric tests on the DUT. The test signal applying and response signal monitoring circuit 10a in accordance with the invention is particularly directed to parametric tests on the DUT. During one case of such testing, a precision measurement unit (PMU) 22a supplies desired voltages or currents to the appropriate pin of the DUT. In such operation, the test head controller 12 closes only relay contact K4a, for example, a reed relay contact, to enable coupling of pin 1 of the DUT to the PMU 22a via a line 24a. Similar PMU's 22b, 22c, . . . 22n can apply controlled test signals to corresponding other pins of the DUT, or one or more PMU's can be multiplexed to the pins.

For quantitative voltage or current measurement, the PMU 22 can be used to apply (force) a precision program specified voltage or current to any desired pin of the DUT. Each PMU 22 preferably provides force and measurement ranges up to +100 volts (V) and 256 milliamperes (mA).

The test head controller 12 can close a relay contact K2a, for example, a reed relay contact, so that the test signal from the PMU 22a coupled to the signal input terminal of the DUT is applied directly to a comparison means 26a. The comparison means 26a can also receive a predicted signal from the test head controller 12 via a line 28a. Consequently, the output signals from the comparison means 26a can change in accordance with the test signal applied to the DUT.

In addition, a data input signal can be transmitted by the test head controller 12 to the comparison means 26a through a line 30a to switch the output signals from the comparison means. The output signal from the comparison means 26a is returned to the test head controller 12 via a line 32a. The output signal from the comparison means 26a on the line 32a can cause the test head controller 12 to register either acceptance or rejection of the DUT, or to specify its quality.

The test head controller 12 and the PMU's 22 allow DC parameter tests. The test head controller 12 and PMU's 22 include the capability for each active test pin, under the control of programmed instructions, to be assigned as an input driver, output comparator, or input/output (I/O) pin. A timing module provides timing edge resolution, which allows the user to accurately place edges when measuring the alternating current (AC) parameters of a high speed DUT. The test rate is programmable. The uninterrupted flow of timed test vectors between the test head controller 12 and the DUT emulates combinations to which the DUT would be subjected in its intended application.

Each PMU 22 preferably includes a digitally programmed source which provides a gated, automatic crossover type forcing function. Four-quadrant operation is preferably provided. The idle (gate off) state is preferably forcing zero volts with current rails set at one percent of the last programmed range. The comparison means 26a included in the PMU 22a preferably comprises on-board analog-to-digital converters (ADC's) for simultaneous conversions of the voltage and current operating point.

With this configuration, an accurate measured value or indication is attained by first parallel loading a selected digital-to-analog converter (DAC) register with an uncalibrated start value. Next, all test associated DAC registers are incremented to force the value. As the voltage at any pin crosses a preset compare level, the contents of the DAC register are latched. The test is completed after all participating pins have crossed the pass/fail boundary. At this time a read of stored values can return accurate measured values. Program selected rolloff allows the test plan to control optimum speed for each test condition.

FIG. 2 is a schematic circuit diagram of the PMU 22. The PMU 22 is described more fully in the aforementioned John Schinabeck and James R. Murdock, patent application entitled METHOD AND APPARATUS FOR APPLYING AND MONITORING PROGRAMMED TEST SIGNALS DURING AUTOMATED TESTING OF ELECTRONIC CIRCUITS, U.S. Ser. No. 06/611,445.

To accomplish go/no-go or analog settling analysis device tests, the four limit registers of the PMU 22 must be active for a non-ambiguous pass/fail decision. Typical user elemental application of these four registers is to define a pass window on the programmed operating characteristic of the PMU 22. For a go/no-go type test, the ADC/ signal is output if the analog to digital conversion result is outside the defined pass window. In the case of analog settling analysis, an ADC/ signal is an indication of a conversion result within the pass window.

When the laws of physics prevail, and required low current ranges force long analog settling times, analog settling analysis in accordance with the invention is used to optimize test rate. Test plan specification for PMU 22 analog settling analysis includes definition of the maximum elapsed time to settle and loading four voltage and current limit registers to define a pass window. A continuous conversion process is initiated shortly after the digitally programmed source is connected and gated on. The digital conversion result is compared to limits, and if an early limit boundary crossing occurs, the test plan is allowed to continue. If no limit boundary crossing occurs before expiration of the maximum time duration, the test plan executes a fail branch.

PMU Elemental Statements

The following statement definitions are the basic set of user visible PMU elementals. None of these statements may be included in a TEST-INIT Packet. All virtual test resource updates occur in PMU[0] VTR. PMU[1 . . . PMU[3] are only used for diagnostic purposes.

| Setting the Forcing And Settling Conditions | | |
|---|---|---|
| PMU-CONDITIONS | (V-FORCE | VOLTS; |
| | V-RANGE | V-RNG-TYPE; |
| | I-FORCE | AMPS; |
| | I-RANGE | I-RNG-TYPE; |
| | V-CONNECT | VOLTS; |
| | USER-DELAY | DELAY-SECONDS; |
| | ROLL-OFF | COMPENSA- |

| Setting the Forcing And Settling Conditions |
|---|
| TION-TYPE); |

This statement loads all the values to be used for a measurement into the virtual test resource. The force values go into the hardware section and the connect voltage and settling time delay go into the software section of the virtual test resource. The run-time MEASURE service selects the appropriate compensation circuit based on the user specified USER-DELAY and selected ROLL-OFF. No tester communication results from this statement.

| Setting the Go/No-go Limits |
|---|
| PMU-V-LIMITS (V-MAX, V-MIN VOLTS); |
| PMU-I-LIMITS (I-MAX,I-MIN AMPS); |
| PMU-LIMITS (V-MAX,V-MIN VOLTS; I-MAX,I-MIN AMPS); |

One of these three statements is used to establish the go/no-go limits for any particular measurement. If the V-LIMITS or I-LIMITS statements are used, the other two (I-LIMITS or V-LIMITS respectively) will be filled in as values closely bracketing the associated forcing function. However, this filling in is done at PMU-MEASURE time based on the software virtual test resource flag MEASURE-RAIL, not at the time the limits are specified. These limit specification statements only load the limit values and set the state of the MEASURE-RAIL flag in the PMU virtual test resource. No tester communication is caused by these statements.

| Specifying the Connection To Be Used |
|---|
| PMU-CONNECT(PMU-REF PMU-REFERENCE-TYPE; |
| NUM-PMUS NUM-PMUS-TYPE; |
| FORCE FORCE-TYPE); |

This statement allows the specification of the various varieties of connection for a PMU. Differential measurement may be specified by putting a DPS number in the PMU-REF parameter. Device ground sense (DGS) is the normal reference and is specified as $-1$ (see constant declarations above). The use of a single PMU or multiple PMU's is declared in the NUM-PMUS parameter. Selection of the voltage measure only mode is made in the FORCE parameter. This statement loads data into the software portion of the PMU virtual test resource only and causes no tester communication.

It is presumed that most measurements will be performed using DGS as reference, ALL-PMU's, Fast-Matrix, Force-and-Measure. This combination is therefore the default and the PMU-CONNECT statement need only be used for other than this combination. If the user has another preferred default, he may state it in the TEST-INIT section of his program and treat it as the default for the duration of his program.

| Performing the Measurement | |
|---|---|
| PMU-MEASURE | MEASURE-METHOD-TYPE; |
| (MEASURE-METHOD | PIN-GRP); |
| PIN-GROUP | |

This is the do it statement for all PMU measurements. It gathers all the data required from the virtual test resource (software and hardware) and combines it with the MEASURE-METHOD and PIN-GROUP parameters to cause a sequence of PMU measurements to be performed. This statement requires a pass/fail decision to be returned, and execution will not proceed until the measurement set is complete. The PMU-MEASURE run-time service will account for all sequencing variations associated with go/no-go, value, v-measure-only, single/multiple PMU's, matrix usage, etc.

The programmable filter settings for PMU 22 settling times for maximum given capacitive load allow program selected rolloff. These filter settings appear in TABLE I below.

TABLE I

PROGRAMMABLE FILTER SETTING FOR PMU SETTLING TIMES FOR MAXIMUM GIVEN CAPACITIVE LOAD

| Current Range | Filter Setting | | | |
|---|---|---|---|---|
| | 30 μs | 1 ms | 10 ms | 100 ms |
| 256 mA | 0.120 μF | 16 μF | 128 μF | 512 μF |
| 128 mA | 0.064 μF | 8 μF | 64 μF | 256 μF |
| 64 mA | 0.032 μF | 4 μF | 32 μF | 128 μF |
| 32 mA | 0.016 μF | 2 μF | 16 μF | 64 μF |
| 16 mA | 8000 pF | 1 μF | 8 μF | 32 μF |
| 8 mA | 4000 pF | 0.512 μF | 4 μF | 16 μF |
| 4 mA | 2000 pF | 0.256 μF | 2 μF | 8 μF |
| 2 mA | 1000 pF | 0.128 μF | 1 μF | 4 μF |
| 1 mA | 512 pF | 0.064 μF | 0.512 μF | 2 μF |
| 512 μA | 256 pF | 0.032 μF | 0.256 μF | 1 μF |
| 256 μA | 128 pF | 0.016 μF | 0.128 μF | 0.512 μF |
| 128 μA | 64 pF | 8000 pF | 0.064 μF | 0.256 μF |
| 64 μA | 32 pF | 4000 pF | 0.032 μF | 0.128 μF |
| 32 μA | — | 2000 pF | 0.016 μF | 0.064 μF |
| 16 μA | — | 1000 pF | 8000 pF | 0.032 μF |
| 8 μA | — | 512 pF | 4000 pF | 0.016 μF |
| 4 μA | — | 256 pF | 2000 pF | 8000 pF |
| 2 μA | — | 128 pF | 1000 pF | 4000 pF |
| 1 μA | — | 64 pF | 512 pF | 2000 pF |
| 0.5 μA | — | 32 pF | 256 pF | 1000 pF |

Times apply for small signal change (non-slew rate or current limited) for less than one percent overshoot of programmed value.

The operation depends upon the two on-board ADC's. They simultaneously digitize the voltage and current of the PMU 22 operating point. For a go/no-go type test, the digitized result is compared to values contained in four limit registers. They are programmed with values to bound a test pass window. The dash lines shown in FIG. 3 define these four limits. Measured value results are available by reading the ADC result.

Analog settling analysis in accordance with the invention is typically applied for low current tests that require unreasonably long times to settle to a stable operating point. Analog settling analysis in accordance with the invention optimizes pass decision time as follows. The pre-conditioned PMU 22 is connected to the DUT, and the digitally programmed source included in the PMU is gated on. While slewing toward the final operating point, the ADC's included in the PMU 22 are triggered repeatedly. Each ADC result is compared to enabled limits. If a result falls within the pass window, the test plan proceeds immediately. If during a maximum time to settle, no pass result is found, a fail branch is undertaken.

Test pass execution times are decreased by 10 to 30 percent of the worst case slew time. In contrast, all tests proceed at worst case rates in known automated electronic test equipment.

Analog settling analysis in accordance with the invention increases the testing rate. Hundreds of milliseconds can be saved each time a test plan is executed. The same minimum and maximum limit registers are used for fast, dual limit go/no-go testing with the analog-to-digital conversion result stored for data log of measured values.

The method and apparatus of this invention have several advantages over the techniques of the prior art. Although a preferred embodiment of the method and apparatus of this invention has been described above, it will be apparent to those skilled in the art that numerous variations can be made without departing from the spirit and scope of the invention as defined by the appended claims.

What is claimed is:

1. A method for repeatedly monitoring the response signal at a node of a deivce under test caused by a test signal applied to the node by digitally programmed source means switchably connected by a first switch means to the node and comparison means switchably connected by a second switch means to the node, the method comprising the steps of:
    connecting the test signal to the node;
    repetitively comparing the response signal voltage and current with programmed reference voltage and current levels; and
    repetitively providing an indication of the relative magnitude of the response signal voltage and current with respect tothe programmed reference levels.

2. The method of claim 1, further comprising the steps of:
    continuing to apply the test signal to and to monitor the response signal at the node in the event that the response signal voltage and current have a first predetermined relationship with respect to the programmed reference levels; and
    providing a fail signal in the event that the response signal voltage and current have a second predetermined relationship with respect to the programmed reference levels.

3. Apparatus for applying a test signal to and monitoring a response signal at a node of a device under test, comprising:
    digitally programmed source means switchably connected by a first switch means to the node for supplying test signals to the node; and
    comparison means switchably connected by a second switch means to the node for indicating the relative magnitude of the response signal voltage and current with respect to programmed reference levels on a repetitive basis.

4. Apparatus as in claim 3, further comprising:
    control means connected to the digitally programmed source means and comparison means for continuing to cause the digitally programmed source means to apply the test signal to and the comparison means to monitor the response signal voltage and current at the node in the event that the response signal voltage and current have a first predetermined relationship with respect to the programmed reference levels; and
    means connected to the comparison means and control means for providing a fail signal in the event that the response signal voltage and current have a second predetermined relationship with respect to the programmed reference levels.

5. Apparatus as in claim 3 wherein the switch means are controlled by a computer means.

6. Apparatus as in claim 5 wherein the switch means comprise reed relays.

7. Apparatus as in claim 5 wherein the computer means comprises a test system controller.

8. A method for repeatedly monitoring the response signal at a node of a device under test caused by a test signal applied to the node by digitally programmed source means having a preselected programmed voltage-current characteristic defined by not-to-exceed voltage rail and current rail levels switchably connected by a first switch means to the node and comparison means switchably connected by a second switch means to the node, the method comprising the steps of:
    connecting the test signal to the node;
    repetitively comparing the response signal voltage at the node with a first programmed voltage level;
    repetitively comparing the response signal voltage at the node with a second programmed voltage level;
    repetitively comparing the response signal current at the node with a first programmed current level;
    repetitively comparing the response signal current at the node with a second programmed current level;
    repetitively providing an indication of the relative amplitude of the response signal voltage and current with respect to the first and second programmed voltage levels and first and second programmed current levels, respectively;
    continuing to apply the test signal to and to monitor the response signal at the node in the event that the response signal voltage and current have a first predetermined relationship with respect to the first and second programmed voltage levels and first and second programmed current levels, respectively; and
    providing a fail signal in the event that the response signal voltage and current have a second predetermined relationship with respect to the first and second programmed voltage levels and first and second programmed current levels, respectively.

9. The method of claim 8 wherein the test signal is a forcing function which starts at zero volts and one percent of the maximum current of a preselected voltage-current range.

10. Apparatus for repeatedly monitoring the response signal at a node of a device under test caused by a test signal applied to the node, comprising:
    digitally programmed source means switchably connected by a first switch means to the node, the digitally programmed source means having a preselected programmed voltage-current characteristic defined by not-to-exceed voltage rail and current rail levels for supplying test signals to the node;
    first comparison mean switchably connected by a second switch means to the node for repetitively indicating the relative amplitude of the response signal voltage at the node with respect to a first programmed voltage level;
    second comparison means switchably connected by the second switch means to the node for repetitively indicating the relative amplitude of the response signal voltage at the node with respect to a second programmed voltage level;
    third comparison means switchably connected by the second switch means to the node for repetitively indicating the relative amplitude of the response signal current at the node with respect to a first programmed current level;

fourth comparison means switchably connected by the second switch means to the node for repetitively indicating the relative amplitude of the response signal current at the node with respect to a second programmed current level;

control means connected to the digitally programmed source means and comparison means for continuing to cause the digitally programmed source means to apply the test signal to and the comparison means to monitor the response signal at the node in the event that the response signal voltage and current have a first predetermined relationship with respect to the first and second programmed voltage levels and first and second programmed current levels, respectively; and means connected to the comparison means and control means for providing a fail signal in the event that the response signal voltage and current have a second predetermined relationship with respect to the first and second programmed voltage levels and first and second programmed current levels, respectively.

11. Apparatus as in claim 10 wherein the digitally programmed source means is a crossover source which supplies a test signal in the form of a forcing function that starts at zero volts and one percent of the maximum current of a preselected voltage-current range.

* * * * *